US006090668A

United States Patent [19]

Lin et al.

[11] Patent Number: 6,090,668

[45] Date of Patent: Jul. 18, 2000

[54] METHOD TO FABRICATE SHARP TIP OF POLY IN SPLIT GATE FLASH

[75] Inventors: Yai-Fen Lin, Taichung; Chia-Ta Hsieh, Tainan; Hung-Cheng Sung, Hsin-Chu; Jung-Ke Yeh, Hsin-Chu; Chang-Song Lin, Hsin-Chu, County; Di-Son Kuo, Hsinchu, all of Taiwan

[73] Assignee: Taiwan Semiconductor Manufacturing Company, Hsin-Chu, Taiwan

[21] Appl. No.: 09/248,725

[22] Filed: Feb. 11, 1999

[51] Int. Cl.[7] .............................................. H01L 21/8247

[52] U.S. Cl. ........................... 438/266; 438/304; 438/596

[58] Field of Search .................................... 438/257, 264, 438/266, 267, 304, 593, 594, 595, 596

[56] References Cited

U.S. PATENT DOCUMENTS

| | | | |
|---|---|---|---|
| 4,295,265 | 10/1981 | Horiuchi et al. | 438/257 |
| 4,861,730 | 8/1989 | Hsia et al. | 437/43 |
| 5,395,779 | 3/1995 | Hong | 438/266 |
| 5,427,968 | 6/1995 | Hong | 437/43 |
| 5,597,751 | 1/1997 | Wang | 437/43 |
| 5,783,473 | 7/1998 | Sung | 438/265 |
| 5,994,184 | 12/1999 | Fukumoto | 438/266 |

*Primary Examiner*—Chandra Chaudhari
*Attorney, Agent, or Firm*—George O. Saile; Stephen B. Ackerman

[57] ABSTRACT

A method is provided for forming a split-gate flash memory cell having a sharp poly tip which substantially improves the erase speed of the cell. The poly tip is formed without the need for conventional oxidation of the polysilicon floating gate. Instead, the polysilicon layer is etched using a high pressure recipe thereby forming a recess with a sloped profile into the polysilicon layer. The recess is filled with a top-oxide, which in turn serves as a hard mask in etching those portions of the polysilicon year not protected by the top-oxide layer. The edge of the polysilicon layer formed by the sloping walls of the recess forms the sharp poly tip of this invention. The sharp tip does not experience the damage caused by conventional poly oxidation processes and, therefore, provides enhanced erase speed for the split-gate flash memory cell. The invention is also directed to a semiconductor device fabricated by the disclosed method.

16 Claims, 6 Drawing Sheets

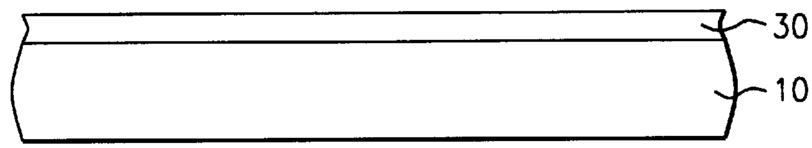
FIG. 1a – Prior Art
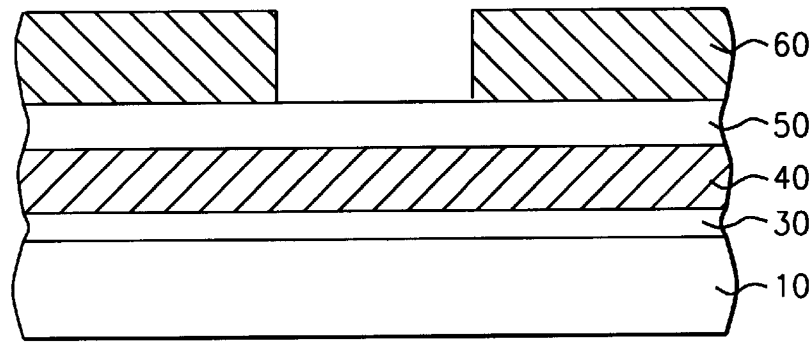
FIG. 1b – Prior Art
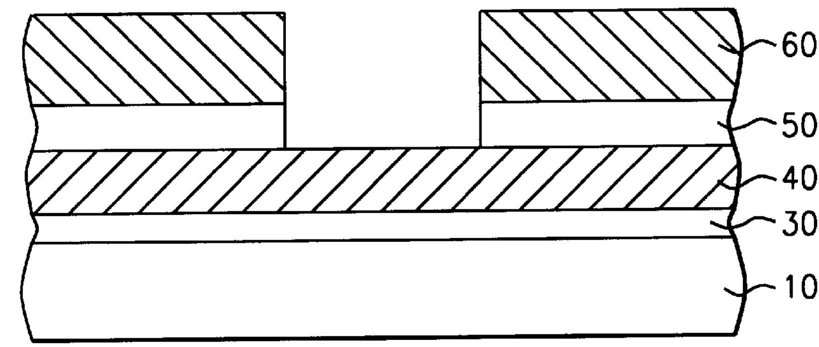
FIG. 1c – Prior Art
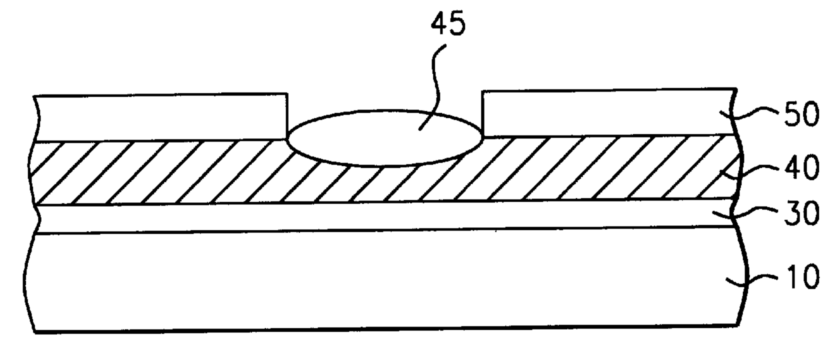
FIG. 1d – Prior Art

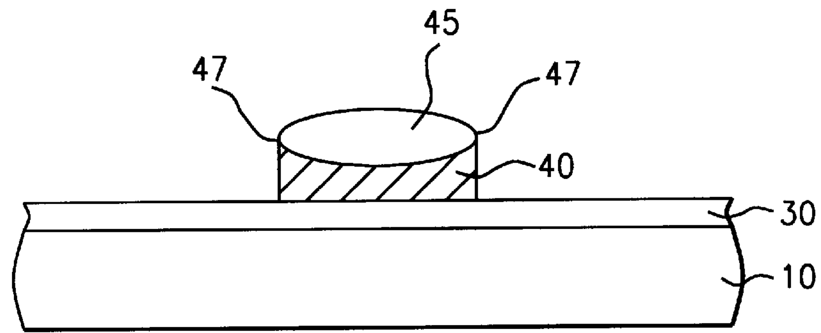
FIG. 1e – Prior Art
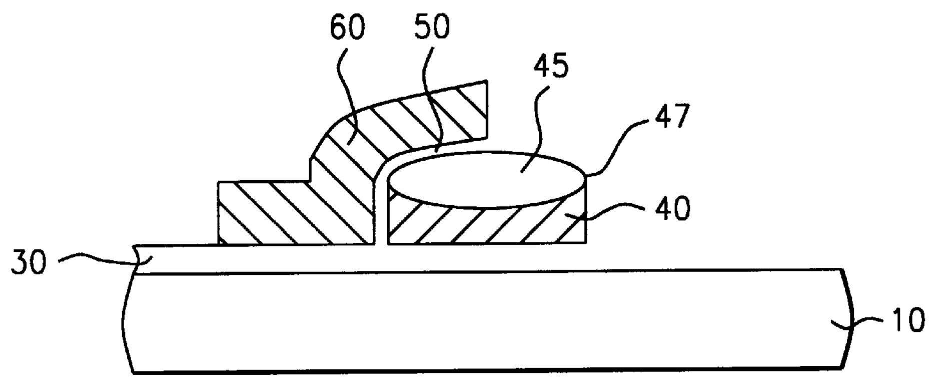
FIG. 1f – Prior Art
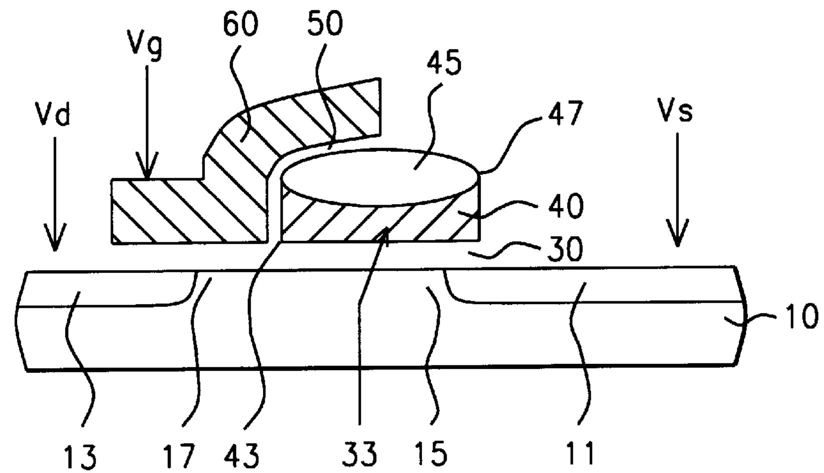
FIG. 1g – Prior Art

METHOD TO FABRICATE SHARP TIP OF POLY IN SPLIT GATE FLASH

BACKGROUND OF THE INVENTION (1) Field of the Invention

The present invention relates to split-gate memory cells used in flash EEPROMs (Electrically Erasable Programmable Read Only Memories), and in particular, to a method of forming a sharp tip of poly to reduce the variation of memory erasing speed resulting from the non-uniformity of so-called gate bird's beak found in conventional in split-gate flash cells.

(2) Description of the Related Art

Conventionally, and as is described more fully below, the floating gate of a split gate memory cell is formed by growing polysilicon oxide, or, polyoxide, on the polysilicon layer that eventually becomes the floating gate while the overlying polyoxide is used as a hard mask to etch the polysilicon gate. However, depending upon the doping, grain size and the oxidation speed of the polysilicon, there is formed around the edges of the polyoxide a protrusion of a particular shape, usually variations on the well known gate bird's beak, into the polysilicon which affects the erase speed of the cell and hence the performance of the memory device. A different technique of forming the oxide over the polysilicon gate is proposed in this invention so that the protrusion in the form of a well defined and sharp poly tip can predictably be formed each time in order to provide a reliable memory cell. The sharpness of the tip improves the erase speed.

The shape and size of different portions of memory cells have different effects on the performance of the memory cells in different ways. Thus, with the one-transistor memory cell, which contains one transistor and one capacitor, many variations of this simple cell have been advanced for the purposes of shrinking the size of the cell and, at the same time, improve its performance. The variations consist of different methods of forming capacitors, with single, double or triple layers of polysilicon, and different materials for the word and bit lines. Another variation which is disclosed in this invention relates to the shape of the edge of the floating gate which significantly affects the erase speed of split-gate flash memory cells.

Memory devices include electrically erasable and electrically programmable read-only memories (EEPROMs) of flash electrically erasable and electrically programmable read-only memories (flash EEPROMs). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

Most conventional flash-EEPROM cells use a double-polysilicon (poly) structure of which the well known split-gate cell is shown in FIG. 1*g*. The forming of the cell is shown in FIGS. 1*a*–1*f* which will be described shortly. In the final form of the cell shown in FIG. 1*g*, a MOS transistor is formed on a semiconductor substrate (10) having a first doped region (11), a second doped region (13), a channel region (15), a gate oxide (30), a floating gate (40), intergate dielectric layer (50) and control gate (60). Substrate (10) and channel region (15) have a first conductivity type, and the first (11) and second (13) doped regions have a second conductivity type that is opposite the first conductivity type.

As seen in FIG. 1*g*, the first doped region, (11), lies within the substrate. The second doped region, (13), lies within substrate (10) and is spaced apart form the first doped region (11). Channel region (15) lies within substrate (10) and between first (11) and second (13) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

In the structure shown in FIG. 1*g*, control gate (60) overlaps the channel region, (17), adjacent to channel (15) under the floating gate, (40). This structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (17) determines the cell performance. Furthermore, the shape of the edge (43) and, in particular, that of edge (47) can affect the programming of the cell. It is disclosed in this invention that the shape and size of edge (47) will affect the programming erase speed of the cell substantially. The relatively rounded shape that is found in conventional cells shown in FIG. 1*g* and which affects the erase speed adversely is the result of the commonly used process which is illustrated in FIGS. 1*a*–1*f*.

In FIG. 1*a*, layer of gate oxide (30) is thermally grown over substrate (10) using conventional methods. Next, a first polysilicon layer (40) is formed followed by the deposition of nitride layer (50). A photoresist layer (60) is then spun over the substrate and then patterned with a floating gate pattern as shown in FIG. 1*b*, which in turn, is etched into the nitride layer (50) as shown in FIG. 1*c*. The photoresist layer, which is no longer needed, is removed. Next, the first polysilicon that is exposed in the pattern openings in the nitride layer is oxidized to form polyoxide (45) as shown in FIG. 1*d*. Subsequently, the nitride layer is removed where now polyoxide (45) serves as a hard mask to remove all the first polysilicon portions except those that are covered by the polyoxide (FIG. 1*e*). As is well known in the art, this is usually accomplished by main etch followed by over-etch. It is at this etching step that the corner edge (47) is usually rounded off, as seen in FIG. 1*e*, which is not desirable for achieving fast program erase speed described below. It will be shown later in the embodiments of this invention that by employing a different process step, the sharpness of corner edge (47) can be preserved such that charge transfer (33) between substrate (10) and floating gate (40), and then the charge transfer (53) between the floating gate and control gate, (60), is fast. The control gate is formed by depositing a second polysilicon layer over intergate layer (50), also known as interpoly, which separates the two polysilicon layers, namely, the floating polygate and the control polygate.

To program the transistor shown in FIG. 1*g*, which is an enlarged view of FIG. 1*f* as well as showing the placement of gate, source and drain voltages or Vg, $V_s$ and $V_d$, respectively, charge is transferred from substrate (10) through gate oxide (30) and is stored on floating gate (40) of the transistor. The amount of charge is set to one of two levels to indicate whether the cell has been programmed "on" of "off." "Reading" of the cell's state is accomplished by applying appropriate voltages to the cell source (11) and drain (13), and to control gate (60), and then sensing the amount of charge on floating gate (40). To erase the contents of the cell, the programming process is reversed, namely, charges are removed from the floating gate by transferring them back to the substrate through the gate oxide.

This programming and erasing of an EEPROM is accomplished electrically and in-circuit by using Fowler-Nordheim tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of importance in the tunneling region is the quality and the thinness of the tunneling oxide separating the floating gate from the substrate.

Several different methods of forming split-gate flash memory cells are described in prior art. Sung in U.S. Pat. No. 5,783,473 teaches a method of manufacturing a split gate flash memory unit where an asperity effect, which is said to cause a detrimental "point discharge" phenomenon, is minimized. A method of making a high density split gate nonvolatile memory cell is proposed by Hsia, et al., in U.S. Pat. No. 4,861,730 by providing a reduced channel length. Wang, on the other hand, shows a single-side oxide sealed salicide process for EEPROMs in U.S. Pat. No. 5,597,751. None of the cited prior art teaches a method to form, nor a structure having, a recess in a polysilicon layer to fabricate a floating gate containing a sloped edge region wherein a sharp poly tip is formed to improve the erase speed of a split gate flash memory cell. Such a method and structure are disclosed in the embodiments of this invention.

SUMMARY OF THE INVENTION

It is therefore an object of this invention to provide method of forming a poly tip without poly oxidation to improve erase speed in split-gate flash memory.

It is another object of this invention to provide a method of depositing an oxide over a floating gate to form a polytip to improve erase speed in split-gate flash memory.

It is yet another object of this invention to provide a method of shaping a poly tip of a memory cell by high pressure etching of the polysilicon floating gate.

These objects are accomplished by providing a silicon substrate having a plurality of active and field regions defined therein; forming a gate oxide layer over said substrate; forming a first polysilicon layer over said gate oxide layer; forming a layer of nitride over said first polysilicon layer; forming and patterning a first photoresist layer to form a photoresist mask with a pattern corresponding to the floating gate of said split-gate flash corresponding to the floating gate of said split-gate flash memory cell; etching said layer of nitride through said photoresist mask to form openings in said layer of nitride and to expose portions of said first polysilicon layer corresponding to said floating gate pattern; performing a high pressure etch to form a recess with a sloped profile in said first polysilicon layer; removing said first photoresist layer; depositing a top-oxide layer into said recess having said sloped profile wherein said top-oxide overfills said recess extending into said opening in said layer of nitride; partially removing said top-oxide from said opening in said layer of nitride; removing said layer of nitride; performing an etch using said top-oxide as a hard mask to etch portions of said first polysilicon layer not covered by said top-oxide to form floating gate underlying said top-oxide; forming an interpoly oxide over said top-oxide layer; depositing a second polysilicon layer over said interpoly oxide; and patterning said second polysilicon layer with a second photoresist mask having control gate pattern to form a control gate to complete the forming of said split-gate flash memory cell having said sharp poly tip to improve erase speed of said memory.

These objects are further accomplished by presenting a split-gate flash memory cell having a poly tip formed in a recess in the floating gate of the cell, which recess is in turn filled with a top-oxide in place of the polyoxide that is normally found in conventional memory cells.

BRIEF DESCRIPTION OF THE DRAWINGS

FIGS. 1*a*–1*g* are cross-sectional views of a portion of a semiconductor substrate showing the steps of forming a conventional split-gate flash memory cell with a conventional gate birds' beak.

Figure 3A:
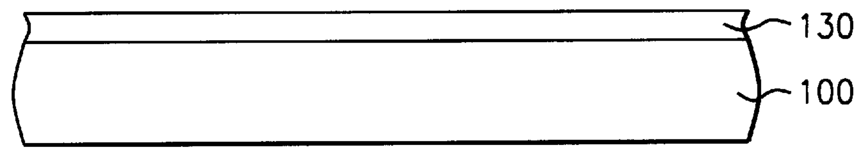
FIGS. 3*a*–3*f* are cross-sectional views corresponding to the top views of the semiconductor substrate shown in FIGS. 2*a*–2*f*.

More specifically,

FIG. 3*a* is a cross-sectional view of a portion of a semiconductor substrate showing the forming of gate oxide, according to this invention.

Figure 3B:
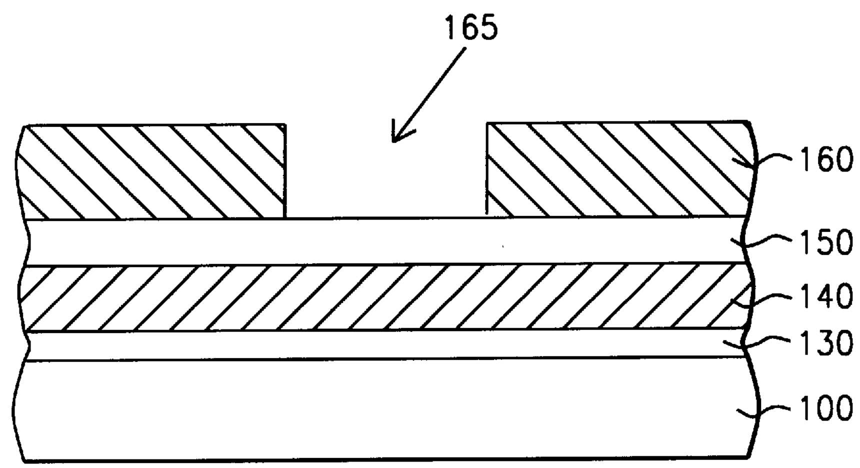

FIG. 3*b* is a cross-sectional view of a portion of a semiconductor substrate showing the forming of a first polysilicon layer, nitride layer, followed by the forming of a patterned photoresist layer, according to this invention.

Figure 3C:
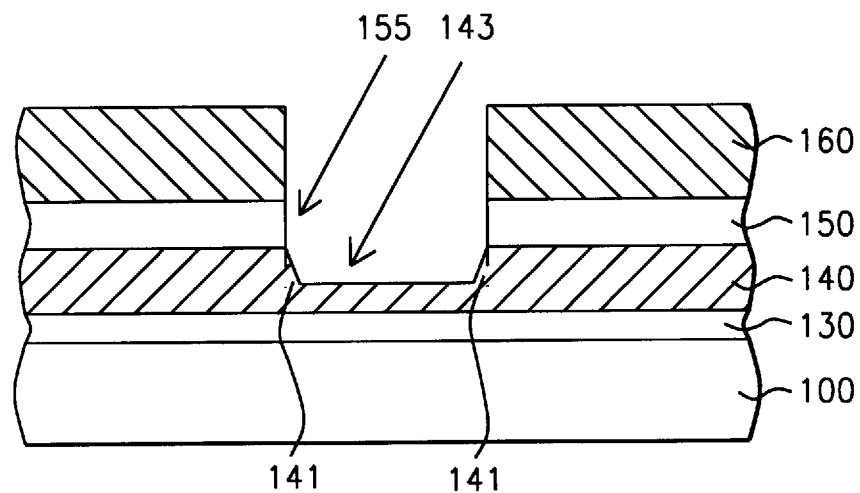

FIG. 3*c* is a cross-sectional view of a portion of a semiconductor substrate showing the forming of an opening in the nitride layer of FIG. 3*b* and the high pressure etching of the polysilicon layer, thus forming a recess with a sloped profile of this invention.

Figure 3D:
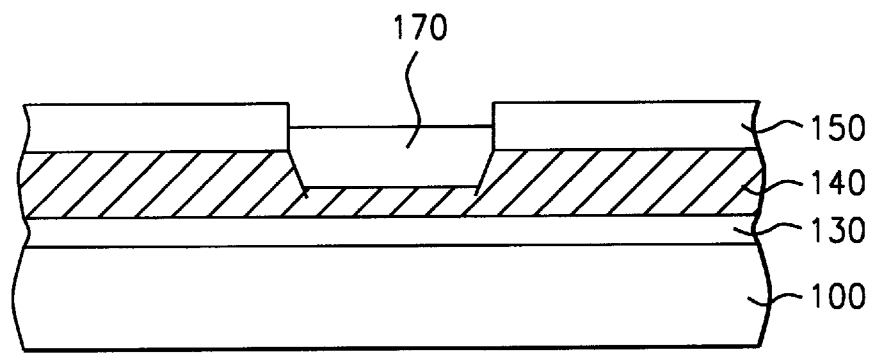

FIG. 3*d* is a cross-sectional view of a portion of a semiconductor substrate showing the forming of a top-oxide layer in the recess of FIG. 3*c*, according to this invention.

Figure 3E:
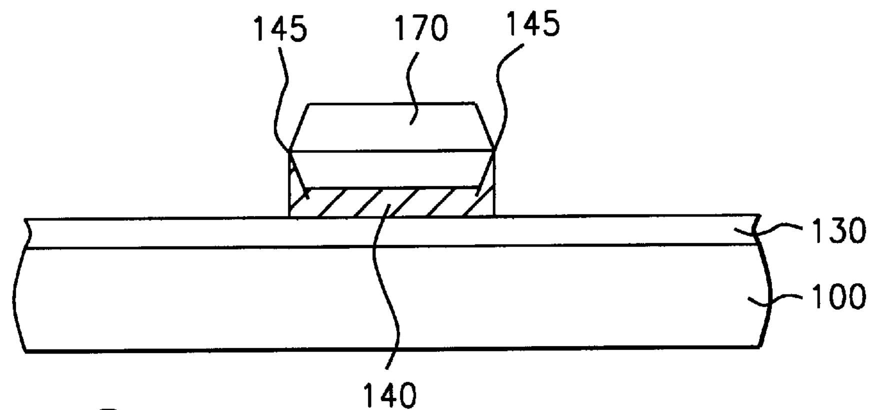

FIG. 3*e* is a cross-sectional view of a portion of a semiconductor substrate showing the etching portions of the polysilicon layer not protected by the top-oxide of FIG. 3*d* of this invention.

Figure 3F:
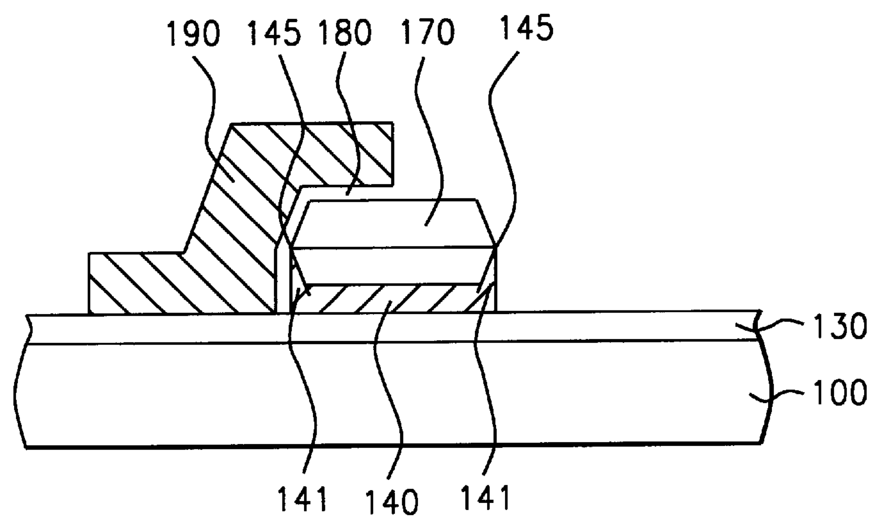

FIG. 3*f* is a cross-sectional view of a portion of a semiconductor substrate showing the completion of the split-gate flash memory cell of this invention having a sharp poly tip formed in a recess having sloped profile without the need for the poly oxidation process of the conventional methods.

DESCRIPTION OF THE PREFERRED EMBODIMENTS

Referring now to the drawings, in particular to FIGS. 2a–2f, and 3a–3f there are shown schematically steps of forming a split-gate flash memory cell having a sharp poly tip wherein polysilicon forms the floating gate of the cell. It will become apparent from the figures that the shape and size of the tip, or "beak" in the conventional sense, is important in that the Fowler-Nordheim (F-N) tunneling that is used in programming and erasing of an EEPROM cell is enhanced usually by providing, what is known as a gate bird's beak (GBB) at the corner of a gate structure of the memory cell. However, the conventional "beak" of the bird's beak is usually long and elongated, thus increasing the size of the cell and at the same time providing paths for current leakage and, therefore, low memory speed. Also, the GBB, because it is long, is easily damaged during the subsequent process steps such as during the forming of the interpoly oxide over the floating gate. Thus, in order to alleviate some of these problems, a different method of forming the beak, or, the poly tip, is disclosed in the embodiment specified below. beak, or, the poly tip, is disclosed in the embodiment specified below.

Figure 2A:
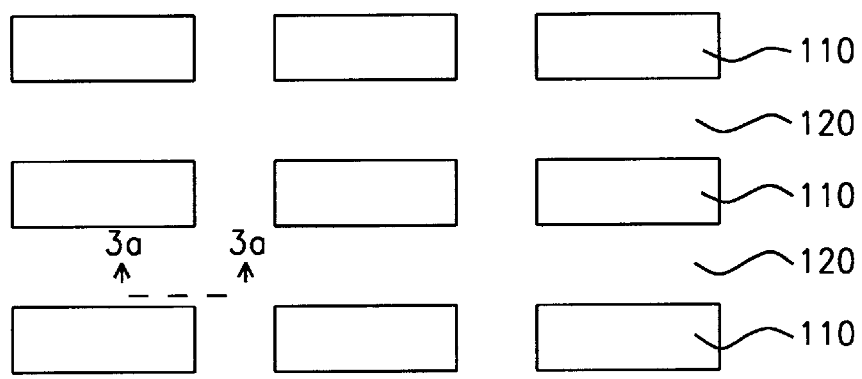
FIGS. 2*a*–2*f* are top views of a semiconductor substrate showing the forming of the poly tip of this invention.

FIGS. 2a–2f show the top views of a semiconductor substrate (100), preferably silicon, at different process steps of forming the poly tip of this invention. FIGS. 3a–3f are cross sections corresponding to the substrate of FIGS. 2a–2f. Following methods well known in the art, substrate (100) is provided with passive filed oxide regions (110) separating active device regions (130) as shown in FIG. 2a. A cross-sectional view of an active region is shown in FIG. 3a. As shown in the same Figure, a gate oxide layer, (130), is formed over substrate (100). Gate oxide (130) can be formed by thermal oxidation process at a temperature between about 800° C. to 900° C. Alternatively, the gate oxide can be formed by an atmospheric or low pressure chemical vapor deposition (LPCVD) process as is well known. Gate oxide layer (130) has a thickness between about 90 to 100 angstroms (Å).

A first polysilicon layer (140) is next deposited over the gate oxide through reduction of $SiH_4$ using LPCVD at a temperature between about 530 to 610° C. The preferred thickness of the first layer of polysilicon is between about 1100 to 1300 Å. This is followed by the forming of a layer of nitride (150) by reacting dichlorosilane ($SiCl_2H_2$) with ammonia ($NH_3$) in an LPCVD at a temperature between about 730 to 830° C. The preferred thickness of the nitride layer is between about 750 to 850 Å.

Figure 2B:
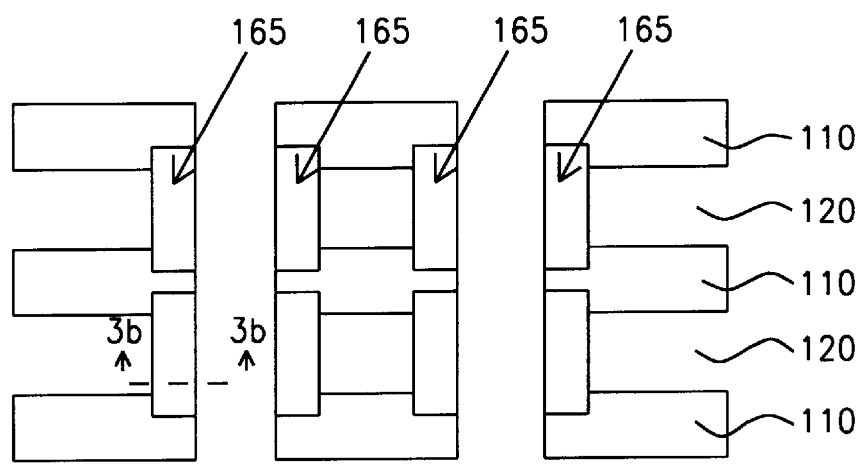

At the next step, using conventional techniques, a first photoresist layer (160) is spun over the nitride layer to form a photoresist mask having patterns (165) corresponding to areas where floating gates are to be defined as shown in both FIGS. 2b and 3b. The patterns are then etched into the nitride layer (150) forming openings (155) where the underlying polysilicon layer (140) is exposed. The etching is accomplished using a recipe comprising gases Ar, $CHF_3$, $C_4F_8$.

Figure 2C:
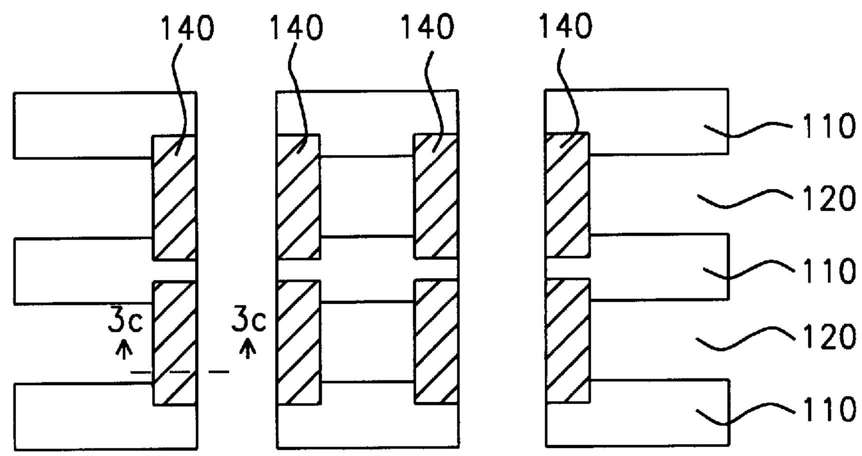
Figure 2D:
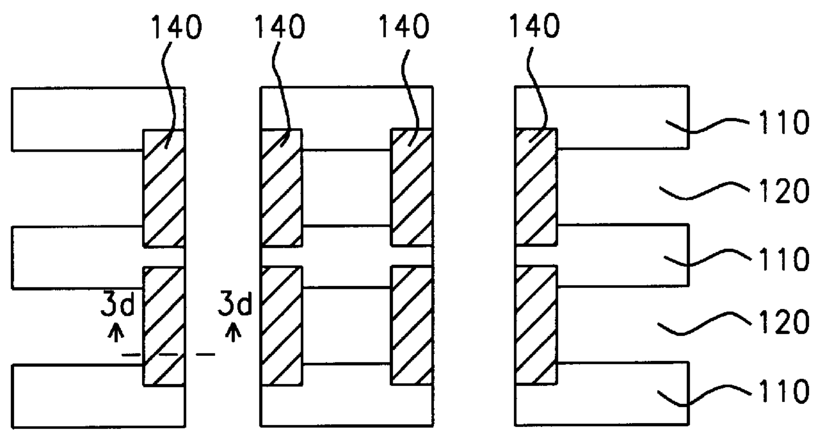
Figure 2E:
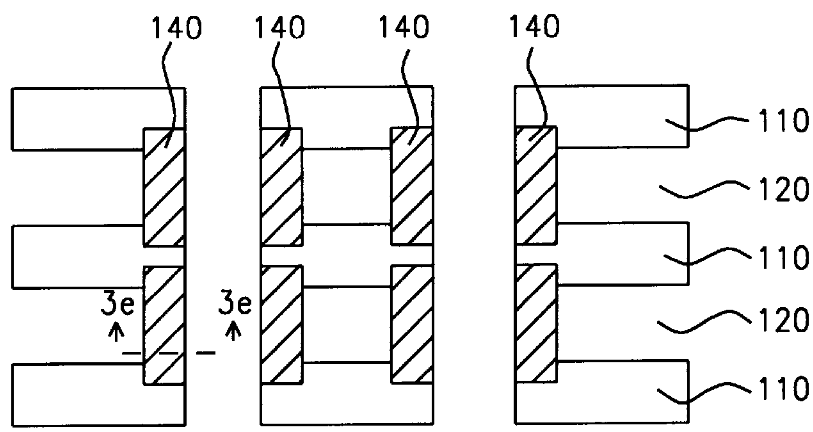
Figure 2F:
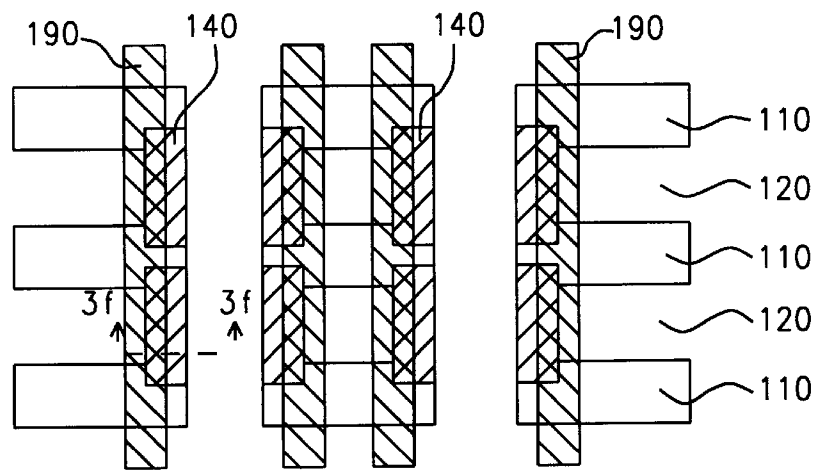

As a main feature and key aspect of the present invention, the portions of the underlying polysilicon layer exposed in the patterned openings of the nitride layer are etched further. It is important that the etch is a high pressure etch in the range between 60 to 120 milli torr (mTorr) using gases Hbr and He at flow rates between about 150 to 250 sccm , 50 to 150 sccm, respectively. The high pressure etch forms the recess (143) shown in FIG. 3c with a sloped profile having a 5 to 25 degree angle (141) from the vertical. The corresponding top view of the substrate is shown in FIG. 2c. The etch should be continued until the recess reaches a depth between about 700 to 800 Å into the first polysilicon layer (140). The polysilicon layer under the recess then assumes a thickness between about 300 to 500 Å.

Once the recess (143) has been formed, the first photoresist layer (160) is removed using the conventional method of oxygen plasma ashing. At the next key step of the present invention, a layer of oxide, or, top-oxide, is deposited over substrate (100) filling the opening (155) in the nitride layer as well as the sloped recess (143) in the first polysilicon layer (140). The substrate is then subjected to chemical-mechanical polishing (CMP) whereby the substrate is planarized as well as some of the top-oxide layer being removed from the opening as shown in FIG. 3d, corresponding to the top view shown in FIG. 2d. It will be noted that nitride layer (150) serves the function of a polish stop. However, the polishing pad (not shown) reaches in to remove some of the top-oxide from the opening. After the CMP, the nitride layer (150) is removed by using a wet solution of $H_3PO_4$, or, phosphoric acid. The same etch recipe used for patterning the nitride layer before may also be used to remove the remaining nitride layer. Then, using the top-oxide layer (170) of FIG. 3d as a hard mask on top of the first polysilicon layer (140), the portions of the polysilicon not protected by the top-oxide are next etched using a recipe comprising preferably $Cl_2$ and HBr gases. The polysilicon layer protected under the top-oxide forms the floating gate (140) of this invention which is separated from the substrate by the gate oxide layer (130) as seen in FIG. 3e.

Comparing FIG. 1e of prior art with FIG. 3e of the present invention, it will be noted in FIG. 1e that the shape of the polyoxide (45) over the floating polygate is generally rounded whereas the top-oxide (170) of the instant invention presents angular slopes so that a sharp poly tip (145) is formed. In other words, the present invention discloses a method of forming a sharp poly tip without the need for the poly oxidation process of prior art which is dependent upon several variables including the level of polysilicon doping, grain size and oxidation rate.

The completion of the split-gate is accomplished by first depositing an interpoly oxide (180) as shown in FIG. 3f. It is preferred that layer (180) is oxynitride, which is well known in the art, and that it has a thickness between about 200 to 300 Å. At the final step, a second layer of polysilicon is deposited over interpoly oxide as shown in the top view in FIG. 2f and is patterned to form the control gate, (190), better seen in the cross-sectional view in FIG. 3f. It is preferred that the second layer of polysilicon is formed using silicon source $SiH_4$ in an LPCVD chamber at a temperature between about 550 to 620° C., and that it has a thickness between about 1000 to 3000 Å.

While the invention has been particularly shown and described with reference to the preferred embodiments thereof, it will be understood by those skilled in the art that various changes in form and details may be made without departing from the spirit and scope of the invention.

What is claimed is:

1. A method of forming a sharp poly tip to improve erase speed in a split-gate flash memory cell comprising the steps of:

providing a silicon substrate having a plurality of active and field regions defined;

forming a gate oxide layer over said substrate;

forming a first polysilicon layer over said gate oxide layer;

forming a layer of nitride over said first polysilicon layer;

forming and patterning a first photoresist layer to form a photoresist mask with a pattern corresponding to the floating gate of said split-gate flash memory cell;

etching said layer of nitride through said photoresist mask to form openings in said layer of nitride and to expose portions of said first polysilicon layer corresponding to said floating gate pattern;

performing a high pressure etch to form a recess with a sloped profile in said first polysilicon layer;

removing said first photoresist layer;

depositing a top-oxide layer into said recess having said sloped profile wherein said top-oxide overfills said recess extending into said opening in said layer of nitride;

partially removing said top-oxide from said opening in said layer of nitride;

removing said layer of nitride;

performing an etch using said top-oxide as a hard mask to etch portions of said first polysilicon layer not covered by said top-oxide to form floating gate underlying said top-oxide;

forming an interpoly oxide over said top-oxide layer;

depositing a second polysilicon layer over said interpoly oxide; and patterning said second polysilicon layer with a second photoresist mask having control gate pattern to form a control gate to complete the forming of said split-gate flash memory cell having said sharp poly tip to improve erase speed of said memory.

2. The method of claim 1, wherein said gate oxide layer has a thickness between about 90 to 100 angstroms (Å).

3. The method of claim 1, wherein said forming a first polysilicon layer is accomplished with silicon source $SiH_4$ using LPCVD at a temperature between about 530 to 610° C.

4. The method of claim 1, wherein said first polysilicon layer has a thickness between about 1100 to 1300 angstroms (Å).

5. The method of claim 1, wherein said forming a layer of nitride is accomplished with LPCVD at a temperature between about 730° C. to 830° C. by reacting dichlorosilane ($SiCl_2H_2$)with ammonia ($NH_3$).

6. The method of claim 4, wherein the thickness of said layer of nitride is between about 750 to 850 Å.

7. The method of claim 1, wherein said etching said layer of nitride is accomplished with etch recipe comprising gases Ar, $CHF_3$, $C_4F_8$.

8. The method of claim 1, wherein said forming a recess having a sloped profile in said first polysilicon layer is accomplished with a recipe comprising gases HBr and He at flow rates between about 150 to 250 and 50 to 150 sccm, respectively, and at a pressure between about 60 to 120 mTorr.

9. The method of claim 1, wherein said recess in said first polysilicon layer has a depth between about 700 to 800 Å.

10. The method of claim 1, wherein the slope of said sloped profile is between about 5 to 25 degrees from the vertical.

11. The method of claim 1, wherein said depositing said top-oxide into said recess is accomplished by CVD method.

12. The method of claim 11, wherein the thickness of said top-oxide is between about 1400 to 1600 Å.

13. The method of claim 1, wherein said etch using said top-oxide as a hard mask to etch portions of said first polysilicon layer is accomplished with a recipe comprising gases HBr and $Cl_2$.

14. The method of claim 1, wherein said interpoly oxide is oxynitride with a thickness between about 150 to 250 Å.

15. The method of claim 1, wherein said depositing a second polysilicon layer over said interpoly oxide is accomplished with silicon source $SiH_4$ using LPCVD at a temperature between about 550 to 620° C.

16. The method of claim 1, wherein said second polysilicon layer to form a control gate has a thickness between about 1000 to 1300 Å.

* * * * *